Figures 9A, 9B:
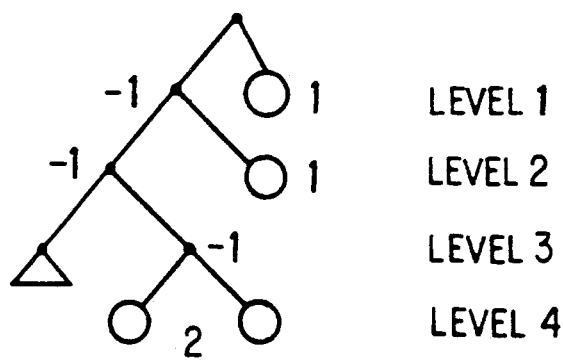

United States Patent [19]

Lepage

[11] Patent Number: 5,077,760
[45] Date of Patent: Dec. 31, 1991

[54] ENCODING METHOD ADAPTED TO THE RECOGNITION OF SYNCHRONIZATION WORKS IN SEQUENCES OF VARIABLE LENGTH ENCODED WORDS

[75] Inventor: Philippe Lepage, Bagneux, France

[73] Assignee: Thomson Consumer Electronics, Courbevoie, France

[21] Appl. No.: 499,283

[22] PCT Filed: Oct. 10, 1989

[86] PCT No.: PCT/FR89/00521

§ 371 Date: Jun. 18, 1990

§ 102(e) Date: Jun. 18, 1990

[87] PCT Pub. No.: WO90/04885

PCT Pub. Date: May 3, 1990

[30] Foreign Application Priority Data

Oct. 19, 1988 [FR] France .................. 88 13760

[51] Int. Cl.⁵ .................................... H04L 7/00
[52] U.S. Cl. .................................. 375/116; 358/319; 358/409
[58] Field of Search ............... 375/114, 116; 341/67, 341/79; 382/56; 371/46; 358/319, 409, 410, 427

[56] References Cited

U.S. PATENT DOCUMENTS

| | | | |
|---|---|---|---|
| 4,475,174 | 10/1984 | Kanayama | 341/67 |
| 4,539,684 | 9/1985 | Kloker | 371/46 |
| 4,853,696 | 8/1989 | Mukherjee | 382/56 |
| 4,870,695 | 9/1989 | Gonzales et al. | 382/56 |
| 4,899,149 | 2/1990 | Kahan | 341/67 |

FOREIGN PATENT DOCUMENTS 0139511 5/1985 European Pat. Off. .
0208537 1/1987 European Pat. Off. .
2123654 2/1984 United Kingdom .

OTHER PUBLICATIONS

IEE Proceedings, Part E, vol. 133, No. 1, Jan. 1986, Stevenage GB pp. 54–63; M. R. Titchener et al.: "Synchronisation Process for the Variable-Length T-Codes".

IEEE Transactions on Information Theory, vol. IT-17, No. 4, Jul. 1971, N.Y., U.S., pp. 478–487; Beulah Rudner: "Constructions of Minimum-Redundancy Codes with an Optimum Synchronizing Property".

Patent Abstracts of Japan, vol. 9, No. 332 (E-370)(2055) Dec, 26, 1985, & JP-A-60 163548, Aug. 26, 1985.

*Primary Examiner*—Stephen Chin
*Attorney, Agent, or Firm*—Oblon, Spivak, McClelland, Maier & Neustadt

[57] ABSTRACT

The encoding method is adapted to the recognition of synchronization words in sequence of variable length encoded words, each encoded word corresponding to a specific message or event from a sequences of messages each assigned with a probability of occurrence. The method consists in constructing a dichotomizing encoding tree comprising a specific number of leaves (F1 ... F4) distributed over priority levels ($n_1 ... n_4$) classified in a decreasing order on processing from the root of the tree towards the leaves, the number of leaves being equal to the number of events to be encoded, in placing the leaves adjacent to one another on each level, the leaves corresponding to the most probable events being placed at one end to the right or to the left on each level, and in prohibiting, in the encoded words, the sequences of Smax bits of equal value, zero or one, in order to obtain an easy choice of synchronization words.

4 Claims, 4 Drawing Sheets

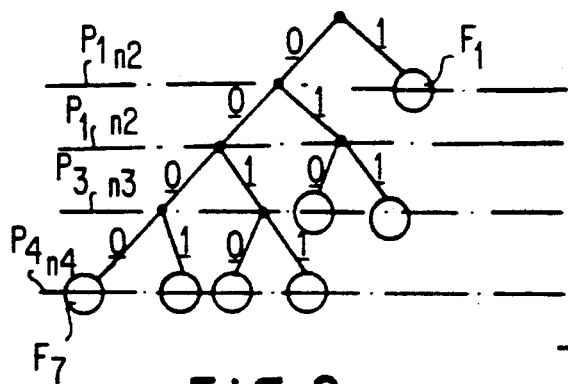
FIG.1A
FIG.1B
FIG.1C
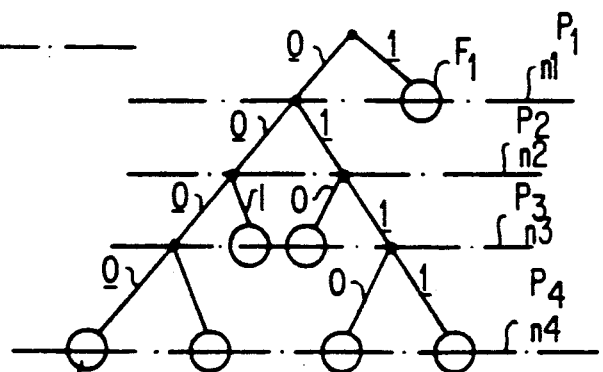
FIG.2
FIG.3
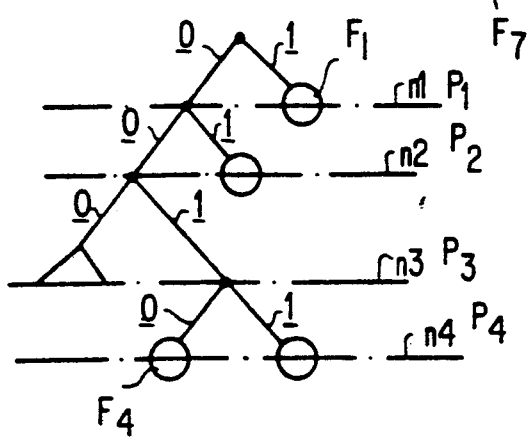
FIG.4

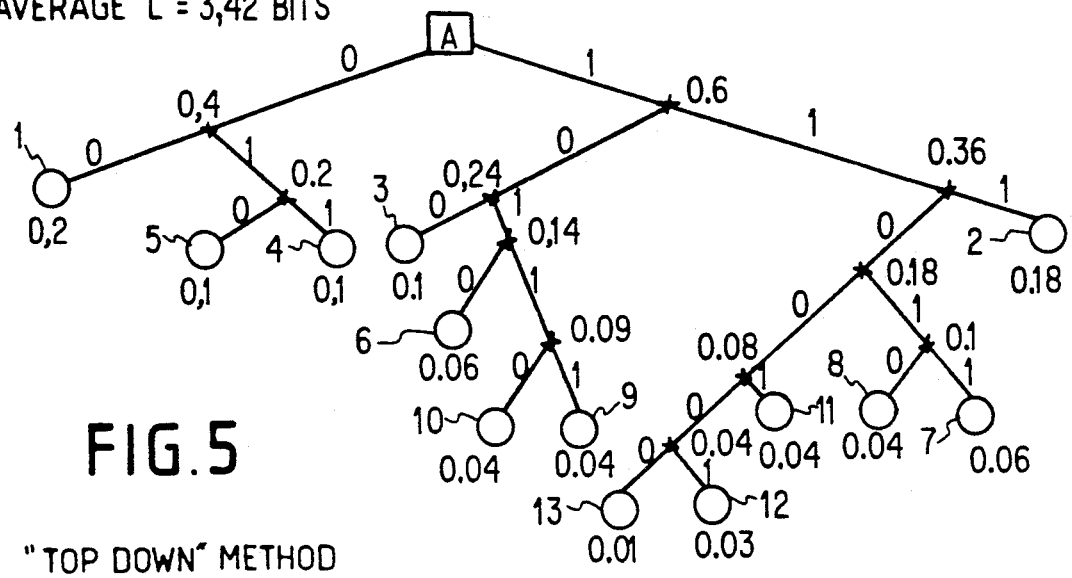
FIG.5 HUFFMAN METHOD AVERAGE L = 3,42 BITS
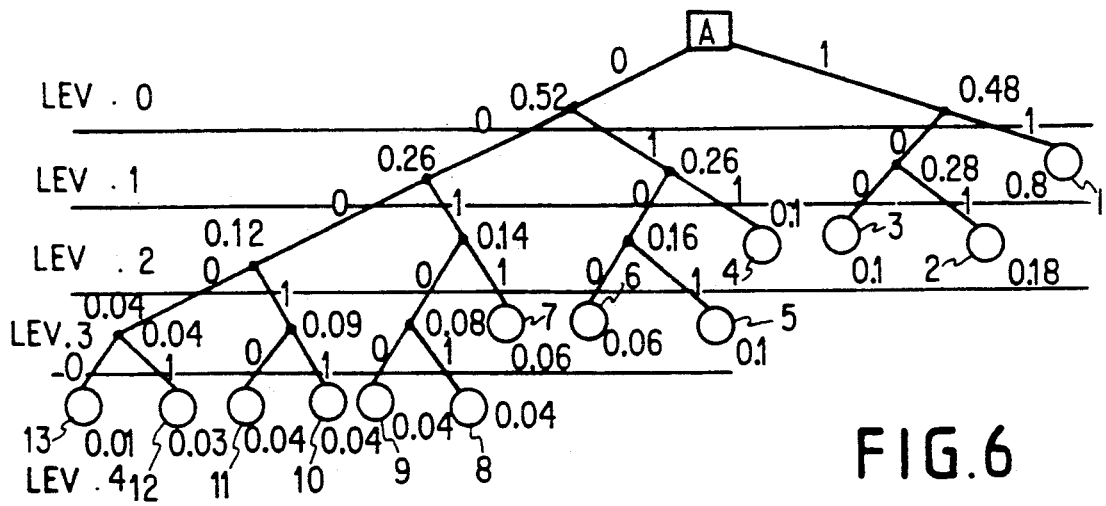
FIG.6 "TOP DOWN" METHOD DEPTH = 5 = 3,42 BITS
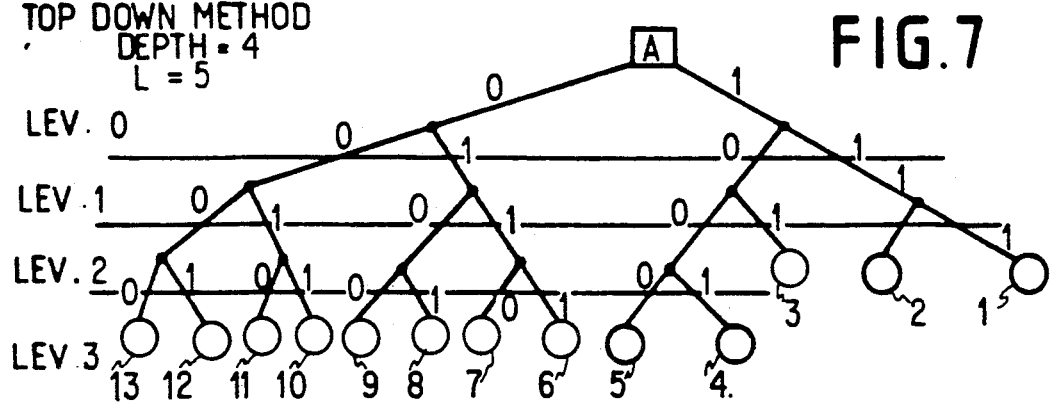
FIG.7 LIMITED DEPTH TOP DOWN METHOD DEPTH = 4 L = 5

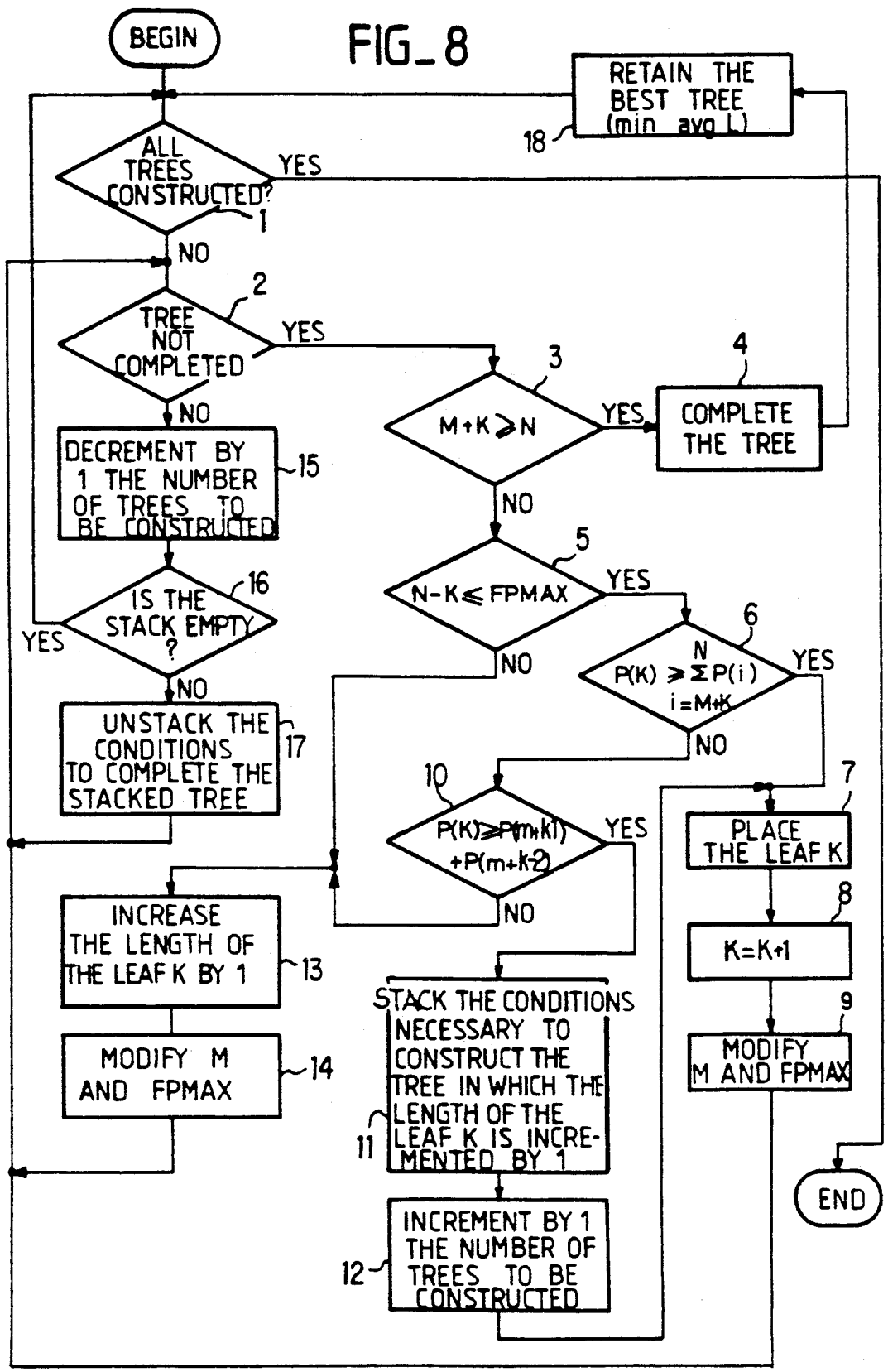

LEVEL 1
LEVEL 2
LEVEL 3
LEVEL 4

| LEVEL | 19 | 20 | POINTER |
|---|---|---|---|
| 1 | −1 | 1 | 19 |
| 2 | −1 | 1 | 19 |
| 3 | 0 | −1 | 19 |
| 4 |  | 2 | 20 |

ENCODING METHOD ADAPTED TO THE RECOGNITION OF SYNCHRONIZATION WORKS IN SEQUENCES OF VARIABLE LENGTH ENCODED WORDS

The present invention relates to a method for recognition of synchronization words in sequences of variable length encoded words. The invention is applied, in particular, in the construction of flow-rate compression systems.

In order to flow-rate limit information transmitted between transmitter and digital television receiver, appeal is often made to the statistical encoding method of Huffman. However, this method involves the construction of variable length code words whose maximum length, which is not controllable, leads to complicated constructions of encoding devices. On the other hand, as the codes have non-uniform lengths, the binary words which they form may be distorted; which thus provokes transmission errors.

In order to limit the propagation and the effect of these errors it is necessary, in general, to partition the information into blocks by inserting synchronization words between the blocks in order to safeguard the synchronization of the receivers in the case of an error. This protection can be obtained by three different methods. A first method consists in ignoring the type of information which is transmitted and in placing a synchronization word after a specific number N of bits used in the transmission. The interesting point in this method is that it fixes the lengths of the blocks and precisely determines the location of the synchronization words. Under these conditions, it is possible to use auto-corrector error codes to protect preferentially the synchronization words. A second method consists in placing a synchronization word after N encoded events. Under these conditions, the location of the synchronization words is not known. However, there exists a possibility of detecting errors since there must always exist a block separation word after N events. Finally, the third method consists in carrying out an encoding in which the number of encoded events and the number of bits per block are not necessarily known. In these last two cases, it is paramount to protect, or at least to recognize, the synchronization words in order to locate effectively the disturbances caused by the errors. However, the existing code correctors do not enable the favouring of the protection of the synchronization words when the locations of the latter are not known.

Hence, the aim of the invention is to palliate this disadvantage.

To this end, the subject of the invention is an encoding method adapted to the recognition of synchronization words in sequences of variable length encoded words, each word code corresponding to a specific message or event from a sequence of messages each assigned with a probability of occurrence, of the type consisting in the construction of a dichotomizing encoding tree comprising a specific number of leaves distributed over priority levels classifed in a decreasing order on proceeding from the root of the tree towards the leaves, the number of leaves being equal to the number of events to be encoded, characterized in that it consists in placing the leaves adjacent to one another on each level, the leaves corresponding to the most probable events being placed at a single right or left end on each level, and in prohibiting, in the encoded words, the sequences of Smax bits of equal value, zero or one.

The invention will be better understood and other characteristics will emerge with the aid of the description which follows with reference to the attached figures which show:

FIGS. 1A, 1B and 1C, synchronization words interposed in bit sequences;

FIG. 2, an illustration of a generation of a left complete encoding tree in the encoding algorithm according to the invention;

FIG. 3, an example to illustrate a left incomplete tree structure;

FIG. 4, an example of the obtainment of a left complete encoding tree comprising a maximum number of zeros equal to 2;

FIG. 5, an illustration of the conventional encoding method of Huffman;

FIG. 6, an illustration of the encoding method implemented by the invention;

FIG. 7, an illustration of the encoding method implemented by the invention obtained by limiting the depth of the encoding;

FIG. 8, a flow diagram to illustrate the encoding method according to the invention;

FIGS. 9A and 9B, an example of an implementation of the previous encoding method to limit the length of the synchronization words on placing prohibited leaves.

The conventional method used to locate a synchronization word in a sequence of binary words consists in intercomparing the weight of several successive bit sequences, each sequence comprising a specific number of bits. As this weight is defined on a bit sequence by the sum of all the "1" bits of the sequence, it is clear that on giving, for example, a weight equal to "0" to the synchronization word, this word becomes perfectly identifiable among the other sequences which have weights greater than "0".

Thus, in the bit sequences shown in FIG. 1A the six "0", bit sequence, labelled MS, and which is interposed between two sequences labelled C comprising several "1" bits, is perfectly recognizable since its weight is zero and the weights of the sequences to the left and to the right of the word MS are respectively three and four. In contrast, if an error intervenes for example in the starred location of the word C to the left, the word MS is recognized, however, with a location error like that appearing in FIG. 1B. The same is true each time that the word C finishes with zeros. These problems can however be solved on adding, as is shown in FIG. 1C, a "1" bit at the end, for example, of the synchronization word MS. Moreover, the solution generalizes for any number of T errors. In this case, the location of the synchronization word can be made certain on condition that the word contains at least $T+1$ "1" bits. In fact, it may be noted that, without taking account of the location of the $T+1$ "1" bits in the synchronization word nor of its length, if T "1" bits are erased in the synchronization word, the position of the word MS is maintained even if the latter is preceded by "0", by virtue of the presence of the remaining "1". The process of detection of the synchronization word for MS results from the convolution product of sequences Q and MS. Considering, for example, the Z transforms of the synchronization word MS and of the sequence Q of the encoded words such as $$MS(Z) = \sum_{L=0}^{S-1} MS_L \cdot Z^{-L} \text{ and } Q(Z) = \sum_{K=-\infty}^{+\infty} Q_K \cdot Z^{-K}$$

with $Q_K = MS_K$ for $K = 0, 1, \ldots S-1$ the convolution product of Q(Z) and of MS(Z) is expressed by the relationship $$Q(Z) \otimes MS(Z) = \sum_{j=-\infty}^{+\infty} \left( \sum_{L=0}^{S-1} Q_{j+L} \otimes MS_L \right) \quad (1)$$

$$Z^j = \sum_{-\infty}^{+\infty} P_j \cdot Z^j$$

where Pj is the Hamming distance D(Ej.MS) between the sequence Ej and the synchronization word MS, this distance being able to be measured by an "exclusive OR" operation between any bit sequence situated to the left or to the right of the synchronization word and the synchronization word itself. The synchronization word MS may then be identified in the presence of T errors only if the Hamming distance Pj previously defined is greater than T+1 for j different from 0. It is sufficient to interpose "1" bits in the synchronization word MS so as to satisfy the equation Pj greater than or equal to T+1 and j smaller than 0.

However, when the number of the events to be encoded is large the Huffman encoding method leads to the use of large lengths synchronization words, difficult to find since numerous code word concatenations have to be observed. In order to simplify the search for the synchronization word, a first solution can consist in prohibiting 0 or 1 sequences in the Huffman encoding tree. But the cost in flow-rate brought about by this solution can be very great since the constraint intervenes even on the most probable event.

The solution implemented by the invention consists in defining an algorithm enabling facilitation of the choice of the synchronization words, enabling unconstrained generation of left complete or respectively right complete trees as is shown in FIG. 2. A left complete tree being a tree in which all the leaves of each level are adjacent, that is to say, in which there exists no intermediate node to separate the leaves on a single level. In FIGS. 2 to 3 the leaves (F1 . . . F4) are represented by circles and the intermediate nodes by points.

In order to limit the length of the synchronization word, according to the invention sequences of more than Smax "0"s (respectively Smax "1"s) are prohibited in the code words. For example in FIG. 4, more than two consecutive 0's (sic) are prohibited in the encoding tree and three "0"s are reserved for the synchronization word. In this way all the binary sequences which finish with Smax+1 "0"s (respectively Smax+1 "1"s) lead to prohibited leaves. An example of a prohibited leaf figures in FIG. 4 through a triangle. The search for the length to be given to the synchronization word MS from the preceding algorithm must take account on the one hand, of the fact that in order to make certain of the location of a word MS in the presence of T or more errors, the word must contain T+1 "1" bits, and on the other hand, of the result PK of the "exclusive OR" operation defined by equation (1), carried out on any sequence of length S with the synchronization word MS. In fact, if no error is evident, the result PK is null and the synchronization word is recognized locationwise without error. However, in the presence of V errors which are less than or equal to T, the result PK is less than or equal to T and then MS is recognized locationwise in the presence of V errors. Consequently, the minimum Hamming distance PK (Pmin) of the sequence of (sic) C relative to MS must be at least equal to T+1 in the presence of T errors. If a synchronization word of S bits tolerates the presence of T errors at most, there will be at most T errors on any sequence of S bits and at worst T "1" bits will be erased from the sequence C. The combined contribution on P is hence, for MS=0

$$P = Pmin + T + D = 2T + 1 + D$$

where D is the Hamming distance.

As the synchronization word in fact comprises T+1 "1" bits, if at worst T+1 "1" bits of any sequence coincide with T+1 "1" bits of the synchronization word, the contribution of these bits to the result PK is null. In general, if T "1" bits of any sequence belonging to C coincide with at most B of the T+1 "1" bits of the synchronization word, the contribution of these bits is null. These considerations enable the definition of the weight P which has to be given to a sequence C of length S in order to obtain protection against T errors. This weight is defined through the equation $$P = B + T + 1 + T \quad (2)$$

B being less than or equal to T+1. The maximum weight of any code sequence other than MS is therefore equal to 3T+2. Consequently, under the assumption that it can be taken as certain that a weight of "1" will be found every (Smax+1) bits in the encoded words, the value of S representing the total length of the synchronization word satisfies the equation $$S = P.(Smax + 1) \quad (3)$$

or again $$S = (3T + 2).(Smax + 1) \quad (4)$$

To summarize, the synchronization word MS must have a length S equal to (3T+2)(Smax+1) and comprise T+1 "1" bits.

The algorithms implemented by the invention for generating the left complete, respectively right complete trees, are borrowed from the conventional method of Huffman. According to the method of Huffman, each set of N events to be encoded is encoded in a set of N binary words or messages the latter being assigned with a numbering system such that the first encoded message always corresponds to the most probable event and that the last message N corresponds to the event having the lowest probability of appearance. The messages 1 to N are thus classified in priority order such that $$P(1) \geq P(2) \geq P(3) \ldots \geq P(N) \quad (5)$$

with the condition that $$\sum_{I=1}^{N} P(I) = 1 \quad (6)$$

In these algorithms the encoding tree possesses a binary structure which is either empty, or formed by a root, or by a binary tree called a left sub-tree (L.S.T) or by a binary tree called a right sub-tree (R.S.T).

By convention, an empty tree is the same as a leaf. A left sub-tree is reached by traversing a branch assigned with 0 and a right sub-tree is reached by traversing a branch assigned with 1. This structure enables representation of the N messages by a binary tree. The code is read by proceeding from the root and by traversing the branches of the tree up until the moment when a leaf is encountered, each leaf representing one event from the N events. The succession of the bits assigned to the branches which enables access to a leaf thus forms the corresponding event code. In this way, if the length L(I) of a code word I, where I belongs to the set of events from 1 to N, is determined by the number of bits contained in the latter, the average length of the code is obtained from the equation $$AVGL = \sum_{I=1}^{N} P(I) \cdot L(I) \tag{7}$$

and the inequality $$L(1) \leq L(2) \leq L(3) \ldots \leq L(N) \tag{8}$$

must be satisfied.

The conventional method of Huffman consists in encoding events from leaves in order to return towards the root of the tree. According to the Huffman algorithm, the N probabilities of the messages or leaves are classified in an increasing order and the two lowest probabilities are set aside in order to form the root of a tree carrying the sum of these two probabilities. The N−1 remaining probabilities are then reordered in an increasing order, then the preceding operations are begun again up until the moment when the number of probabilities of the sort which is being carried out becomes null. Thus, for example, the encoding of messages A', B', C', D', E', F', G', H', I', J', K', L', M' respectively assigned the following probabilities of occurrence 0.2; 0.18; 0.1; 0.1; 0.1; 0.06; 0.06; 0.04; 0.04; 0.04; 0.04; 0.03 and 0.01 and leaf numerals (1, 2, ... 13) gives, on using the previously described algorithm, the tree which is shown in FIG. 5.

However, since the encoding is determined by a movement from the leaves towards the roots, the depth of the tree, which is also the depth which corresponds to the number of bits of the least probable word, is not known until the latter is constructed. This fact may be prejudicial in obtaining a low complexity suited to encoding as well as decoding.

The method according to the invention palliates this disadvantage through the algorithms described hereafter which enable the encoding of the events, not by traversing the encoding tree from the leaves towards the roots, but on the contrary, by proceeding from the root in order to descend towards the leaves.

A first method called "TOP-DOWN" consists in constructing a left (respectively right) complete tree whilst each time checking that the leaves of messages 1 to K−1 are placed in the tree, in placing the leaf of the message K as far as possible to the right (respectively to the left) at the depth B under consideration, as is shown in FIG. 6, and the number M of leaves or of roots of the tree at the depth B+1 is determined through the equation $$M = 2^{L(K)+1} \left( 1 - \sum_{j=1}^{K} 2^{-L(j)} \right) \tag{9}$$

As in the Huffman algorithm the leaves or tree roots K+1 to K+N carry a probability P(I), insofar as a leaf is concerned, or a sum of probabilities insofar as a tree root is concerned. The act of trying to construct a left complete tree comes down to carrying out a sort simulation by increasing order of the probabilities at the depth B+1.

Since the probabilities are assumed to be sorted if the relationship $$P(K) \geq \sum_{I=M+K}^{N} P(I) \tag{10}$$

is satisfied, then the leaf F(K) may be assumed to be placed in the correct position.

In the opposite case, if the relationship:

$$P(K) < \sum_{I=M+K}^{N} P(I) \tag{11}$$

is satisfied then, it is necessary to compare the probability P(K) with the sum of the probabilities P(M+K−1) and P(M+K−2) of the leaves K+M−1 and K+M+2.

If P(M+K−1)+P(M+K−2) is less than the probability P(K), the leaf F(K) is not in place and the length of the code of the message K must be incremented by 1. By contrast, if P(M+K−1)+P(M+k−2) is greater than or equal to P(K), the unique solution consists in constructing two trees, a first tree in which the leaf F(K) is placed at this position and a second tree on incrementing by 1 the length of the code word K.

The subsequent operations then consist, if the leaf F(K) is assumed to be placed in the correct position, in attempting to place the leaf F(K+1) at the same depth B as the leaf F(K). However if the length of the code word K is incremented by 1, the previous algorithm is executed once again up until the moment when the leaf F(K) is actually placed. In the case when two trees are to be constructed, the tree in which the leaf is assumed to be placed is completed and the conditions necessary for the continuation of the construction of the other tree are stacked up.

A corresponding program enabling the execution of the previously described algorithm is as follows.

```
(INITIALIZATION FOR THE FIRST LEAF F1 OF THE FIRST TREE)
WHILE ALL THE TREES HAVE NOT BEEN CONSTRUCTED DO:
    WHILE THE CURRENTLY PROCESSED TREE IS NOT COMPLETED
    DO
    IF I ≥ N
    THEN COMPLETE THE CURRENTLY PROCESSED TREE
                         N
    ELSE IF P(K) ≥      Σ      P(I)
                       I=M+K
        THEN     PLACE THE LEAF FK (INITIALIZATION)
```

| (INITIALIZATION FOR THE FIRST LEAF F1 OF THE FIRST TREE) |
|---|
| -continued |

```
                    PHASE TAKEN INTO ACCOUNT (?))
        ELSE    IF P(K) ≧ P(I−1) + P(I−2)
                    THEN        (CONSTRUCT TWO TREES)
                                - LEAF FK PLACED
                                - LENGTH OF MESSAGE K
                                INCREASED BY 1 (sic)
                                (CONDITIONS STACKED)
                    ELSE        INCREASE THE LENGTH OF THE
                                MESSAGE K BY 1
                                (END OF INITIALIZATION PHASE)
                    ENDIF.
                ENDIF;
            ENDIF;
            (THE PROCESSING CONTINUES WHILE THE TREE IS NOT
            COMPLETE)
        DONE:
        THE BEST TREE IS RETAINED, AND THE TREE CORRESPOND-
        ING TO THE LAST CONDITIONS STACKED IS CONSTRUCTED.
        IF THE STACK IS EMPTY, FINISH
DONE;
END.
```

The preceding algorithm can be perfected by limiting the encoding depth. In fact, if Pmax denotes the maximum authorized encoding depth and if the number of events N is less than or equal to $2^{Pmax}$ it is possible to find the optimum tree which possesses the depth Pmax. In order to obtain this tree, it is sufficient to insist that the message numeral K has a length incremented by 1 if the number of leaves possible at the level Pmax is less than the number of messages remaining to be placed N−K, as the variable I=M+K is less than the number N of leaves to be placed, the preceding constraint is the tightest. This method is interesting since it corresponds to the minimum constraint necessary to a strict limitation of the depth and it enables minimization of the loss in the average flow-rate. The number of leaves possible at the depth Pmax is then given by the equation:

$$FPMAX = 2^{PMAX}\left(1 - \sum_{j=1}^{K} 2^{-L(j)}\right) \quad (12)$$

A corresponding program whose steps 1 to 18 are illustrated by the flow diagram in FIG. 8 is as follows:

| (INITIALIZATION FOR THE FIRST LEAF F1 OF THE FIRST TREE) |
|---|

```
WHILE ALL THE TREES HAVE NOT BEEN CONSTRUCTED DO:
        WHILE THE TREE IS NOT COMPLETED DO
        IF I ≧ N
        THEN COMPLETE THE CURRENTLY PROCESSED TREE
        ELSE    IF N−K ≦ FPMAX
                                        N
                    THEN IF P(K) ≧     Σ
                                        I=M+K
                        THEN -    PLACE THE LEAF FK
                                    (INITIALIZATION PHASE TAKEN
                                    INTO ACCOUNT (?))
                                    - MODIFICATION OF FPMAX.
                        ELSE IF P(K) > P(I−1) + (P(I−2) (sic)
                                    THEN (CONSTRUCT TWO TREES)
                                    - LEAF FK PLACED
                                    - MODIFICATION OF FPMAX.
                                    - LENGTH OF THE MESSAGE K
                                    INCREASED BY 1 (CONDITIONS
                                    STACKED).
                                    ELSE INCREASE THE LENGTH OF THE
                                        MESSAGE K BY 1
                                        (END OF INITIALIZATION
                                        PHASE).
                                        - MODIFICATION OF FPMAX
                        ENDIF;
                    ENDIF.
                    ELSE IF N−K > FPMAX
                            IT IS OBLIGATORY TO INCREASE THE
                            LENGTH OF THE CODE WORD K BY 1. (END
                            OF INITIALIZATION PHASE)
                            - MODIFICATION OF FPMAX.
                ENDIF;
                (THE PROCESSING CONTINUES WHILE THE TREE IS NOT
                    COMPLETED)
            DONE:
            THE BEST TREE IS RETAINED, AND THE TREE CORRESPOND-
            ING TO THE LAST CONDITIONS STACKED IS CONSTRUCTED.
            IF THE STACK IS EMPTY, FINISH
        DONE;
```

-continued (INITIALIZATION FOR THE FIRST LEAF F1 OF THE FIRST TREE)

END;

The satisfaction of the constraints imposed by the search for the synchronization word, namely that sequences of more than max "0"s in a tree are prohibited and that prohibited leaves are inserted in the tree adopted, can be followed with the aid of a particular representation according to a table with two dimensions in which the first vertical dimension represents the levels in the tree and the second horizontal dimension characterizes the distribution of the intermediate nodes-leaves and prohibited leaves.

As shown in FIGS. 9A and 9B a positive number characterizes a number of leaves placed side by side in the tree, a negative number characterizes a number of intermediate nodes placed side by side and the representation of a "0" characterizes a prohibited leaf. The last element of each level is a pointer which indicates for all time the address of the last element placed. This pointer belongs to the stacked conditions. It enables, on defoliation of an incomplete tree, the continuation of the calculations at the useful leaf. If Si denotes a sequence of I"0"s (respectively I"1"s) less than or equal to Smax, in order to construct the condition on the sequences of the "0"s it is necessary to know for all time during the execution of the algorithm, the set of the values of the sequences SI at the current level B and at the subsequent level B+1. The sequences SI are sequences of "0"s on which it is attempted to place the leaves, the intermediate nodes, the prohibited leaves. Denoting by SIK the sequence of "0"s of the tree in which it is attempted to place the current leaf of numeral K, and whilst conforming to the depth limitation, it is necessary to calculate for all time the variations of FPmax as a function of SIK, LK (length of the current code word) and Pmax. Two functions are then used. The first function FP(SIK,LK,Pmax) calculates the modification in the possible number of leaves at the level Pmax when the leaf K is assumed to be placed, the leaves 1 to K−1 being already placed in the tree. The second function FNP(SIK,LK,Pmax) enables calculation of the modification of the possible number of leaves at the level Pmax, the leaves 1 to K−1 being already placed in the tree, the leaf K is assumed to be placed seeing its length incremented by 1. The variations in the number of leaves at the level Pmax are calculated only once if necessary, the corresponding results are used numerous times in the course of the operation of the algorithm. When a code word numeral K sees its length incremented by 1 the prohibited leaves of the current level B can then no longer be eliminated and this contributes to the loss in the average length of the code but may nevertheless serve for the detection of errors. By contrast, the possible prohibited leaves at the level B+1 may be eliminated. In fact, if having placed the leaf numeral K−1, it is attempted to place the leaf numeral K at the same level on the sequence Smax of 0s a prohibited leaf disappears. In the operation of the algorithm all the possible prohibited leaves must be considered.

I claim:

1. Encoding method adapted to the recognition of synchronization words in sequences of variable length encoded words, each encoded word corresponding to a specific message or event from a sequence of messages, each message assigned with a probability of occurrence, wherein a dichotomizing encoding tree comprising a specific number of leaves distributed over priority levels $n_1 \ldots n_4$ classified in a decreasing order on proceeding from the root of the tree towards the leaves is constructed, the number of leaves being equal to the number of events to be encoded, said method comprising:
   placing the leaves adjacent to one another on each level, the leaves corresponding to the most probable events being placed at a single right or left end on each level, and
   prohibiting. in the encoded words, sequences of 1's or 0's greater than a predetermined number, Smax, of bits.

2. Method according to claim 1, characterized in that the length of the synchronization word is equal to (3T+2) times the number of bits Smax+1, T denoting the maximum number of tolerated bit transmission errors.

3. Method according to either of claims 1 and 2, wherein to place a leaf F(K) at a definite position of a priority level ($n_i$) in the encoding tree, said method comprises:
   comparing the probability P(K) of the leaf F(K) with the sum S of the probabilities of the leaves remaining to be placed, where $$\sum_{I=M+K}^{N} P(I) = S;$$

placing the leaf F(K) at said definite position if the probability P(K) of leaf F(K) is greater than or equal to S, and
   comparing in the contrary case the probability P(K) of leaf F(K) with the sum P(M+K−1)+P(M+K−2) of the probabilities of the leaves F(M+K−1) and F(M+K−2) situated at the lower priority level to increment by 1 the length of the message K, or to maintain the leaf F(K) at this position.

4. Method according to claim 3, comprising:
   reading the event codes by proceeding from the root and by traversing the branches of the tree up until the moment a leaf is encountered.

* * * * *

UNITED STATES PATENT AND TRADEMARK OFFICE
CERTIFICATE OF CORRECTION

PATENT NO. : 5,077,760
DATED : December 31, 1991
INVENTOR(S) : Philippe Lepage It is certified that error appears in the above identified patent and that said Letters Patent is hereby corrected as shown below:

On the Title page, item [54] and col. 1
The title is incorrect, should be, --ENCODING METHOD ADAPTED TO THE RECOGNITION OF SYNCHRONIZATION WORDS IN SEQUENCES OF VARIABLE LENGTH ENCODED WORDS--.

Signed and Sealed this

Twenty-fifth Day of May, 1993

Attest:

MICHAEL K. KIRK

Attesting Officer

Acting Commissioner of Patents and Trademarks